(12) United States Patent
Li et al.

(10) Patent No.: US 11,115,071 B2
(45) Date of Patent: Sep. 7, 2021

(54) MULTIMODE AND MULTI-FREQUENCY RADIO FREQUENCY FRONT END MODULE, CHIP, AND COMMUNICATION TERMINAL

(71) Applicants: Hao Li, Shanghai (CN); Yunfang Bai, Shanghai (CN)

(72) Inventors: Hao Li, Shanghai (CN); Yunfang Bai, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 17/027,709

(22) Filed: Sep. 22, 2020

(65) Prior Publication Data
US 2021/0006276 A1     Jan. 7, 2021

Related U.S. Application Data

(63) Continuation of application No. PCT/CN2019/079013, filed on Mar. 21, 2019.

(30) Foreign Application Priority Data

Mar. 22, 2018    (CN) .......................... 201810241355.8

(51) Int. Cl.
*H04B 1/04*  (2006.01)
*H04B 1/44*  (2006.01)
*H04W 88/06* (2009.01)

(52) U.S. Cl.
CPC ......... *H04B 1/0483* (2013.01); *H04B 1/0458* (2013.01); *H04B 1/44* (2013.01)

(58) Field of Classification Search
CPC ........ H04B 1/006; H04B 1/04; H04B 1/0458; H04B 1/0483; H04B 1/16; H04B 1/18;
(Continued)

(56) References Cited

U.S. PATENT DOCUMENTS 9,231,536 B2 *  1/2016  Descios ................. H03F 3/211
9,418,950 B2 *  8/2016  Zhang ..................... H04B 1/16
(Continued)

FOREIGN PATENT DOCUMENTS

CN              101902243 A   * 12/2010

*Primary Examiner* — Quochien B Vuong
(74) *Attorney, Agent, or Firm* — Guosheng Wang; United States Research and Patent Firm

(57) ABSTRACT

Disclosed in the present invention are a multimode and multi-frequency radio frequency front end module, a chip, and a communication terminal. The radio frequency front end module comprises an input matching unit, an amplification unit, a first output matching module, a first switch module, a second matching module, and a control unit. The control unit is connected to the first switch module and is used for controlling a switch state of the first switch module, so as to input a radio frequency signal to one or more radio frequency transmission paths. According to the present invention, radio frequency transmission paths matching the radio frequency front end module can be selected according to different frequency bands under different modes and the control unit controls corresponding switches to be in switch-off and switch-on states, thereby implementing output of radio frequency signals at the different frequency bands under the different modes

12 Claims, 6 Drawing Sheets

(58) Field of Classification Search
CPC ... H04B 1/40; H04B 1/44; H04B 1/48; H04B 1/401; H04B 1/406; H04B 2001/0408; H04W 88/02; H04W 88/06; H03F 3/191; H03F 3/195; H03F 3/213; H03F 2200/111; H03F 2200/222; H03F 2200/387; H03F 2200/391; H03F 2200/396; H03F 2200/451

See application file for complete search history.

(56) References Cited

U.S. PATENT DOCUMENTS

| | | | |
|---|---|---|---|
| 9,531,413 B2* | 12/2016 | Sun | H04B 1/44 |
| 9,966,980 B2* | 5/2018 | Kondo | H04B 1/04 |
| 10,355,850 B2* | 7/2019 | Yoshimi | H04B 1/44 |
| 10,367,455 B2* | 7/2019 | Takenaka | H04B 1/18 |

* cited by examiner

MULTIMODE AND MULTI-FREQUENCY RADIO FREQUENCY FRONT END MODULE, CHIP, AND COMMUNICATION TERMINAL

BACKGROUND

Technical Field

The present invention relates to a multi-mode and multi-frequency radio frequency front end module, and also to an integrated circuit chip including the multi-mode and multi-frequency radio frequency front end module and a corresponding communication terminal, belonging to the field of radio frequency integrated circuit technologies.

Related Art

With the advancement of science and technology, the mobile communication technology has experienced 2G, 3G, and the current 4G that is widely used, and future 5G is in active deployment. Because modes and frequency bands used by various mobile communication technologies are different, it is necessary for manufacturers of mobile communication devices to design a communication device that can use a plurality of frequency bands and modes.

The radio frequency front end module (RFFEM for short) is an important radio frequency element that cannot be integrated by a transceiver in current mobile communication devices. In the radio frequency front end module, a modulated radio frequency signal is amplified to a particular power value through a power amplifier, and then the amplified radio frequency signal is sent out through an antenna.

As shown in FIG. 1, an existing typical radio frequency front end module includes an input matching circuit 110, an amplification unit 120, an output matching circuit 171, a switching unit 152 and a control unit 100. During practical application, the amplification unit 120 is often designed as a broadband amplifier on a specified frequency band. For example, the broadband amplifier covers frequency bands in the range of 2300 MHz to 2700 MHz, and the frequency range includes a plurality of frequency bands in TDD+LTE mode. The plurality of frequency bands are respectively a B40 frequency band (2300 MHz to 2400 MHz), a B41 frequency band (2496 MHz to 2690 MHz) and a B38 frequency band (2570 MHz to 2620 MHz) of TDD+LTE, and a B7 frequency band (2496 MHz to 2570 MHz) in FDD+LTE mode is also included. The input matching circuit 110 and the output matching circuit 171 are designed to correspond to a frequency range of the amplification unit 120.

The existing radio frequency front end module cannot meet different requirements of radio frequency signals in different frequency bands under different modes. For example, in FDD_LTE mode, series connection of a single-pole M-throw switch of the existing radio frequency front end module in a signal path will cause additional power loss, which makes a working current of the radio frequency front end module significantly increase, and causes corresponding obvious heating. There will also be parasitic capacitance between a common port of the single-pole M-throw switch and an output port of the switch, which affects the signal matching effect. Therefore, linearity and output power of a radio frequency signal outputted by the radio frequency front end module are significantly deteriorated.

SUMMARY

The primary technical problem to be solved by the present invention is to provide a multi-mode multi-frequency radio frequency front end module (hereinafter briefly referred to as radio frequency front end module).

Another technical problem to be solved by the present invention is to provide a chip including the radio frequency front end module and a corresponding communication terminal.

To achieve the foregoing inventive objectives, the following technical solutions are used in the present invention:

According to a first aspect of the embodiments of the present invention, a multi-mode and multi-frequency radio frequency front end module is provided, including an input matching unit, an amplification unit, an output matching unit and a control unit; where the output matching unit includes a first output matching module, a first switch module and a second output matching module, a radio frequency signal input end is connected to an input end of the amplification unit through the input matching unit; an output end of the amplification unit is connected to an input end of the first output matching module; an output end of the first output matching module is correspondingly connected to an input end of the first switch module, an input end of the second output matching module and a radio frequency transmission path; an output end of the first switch module and an output end of the second output matching module are separately grounded; the control unit is connected to the amplification unit; and the control unit is connected to the first switch module and is configured to control an on-off state of the first switch module, to input a radio frequency signal to one or more radio frequency transmission paths.

Preferably, the input matching unit is configured to implement impedance matching between a signal source and the amplification unit; the output matching unit is configured to implement impedance matching between the amplification unit and the one or more radio frequency transmission paths; and after the radio frequency signal is divided into one or more paths of radio frequency signals, the radio frequency signal is inputted into the corresponding one or more radio frequency transmission paths by controlling the first switch module.

Preferably, the first switch module includes m switches, m being a positive integer; and one end of each switch is connected to a corresponding radio frequency transmission path and a corresponding output end in the first output matching module, and the other end of the each switch is grounded.

Preferably, in a case that the radio frequency transmission path receives the radio frequency signal, the control unit controls a switch connected to the radio frequency transmission path receiving the radio frequency signal to be in a switch-off state, and controls a switch connected to the radio frequency transmission path not receiving the radio frequency signal to be in a switch-on state.

Preferably, the first output matching module includes a first capacitor and s first inductors, and the second output matching module includes t second capacitors, s and t being positive integers; one end of the first capacitor is connected to the output end of the amplification unit, and the other end of the first capacitor is connected to one end of each first inductor, and the other end of the each first inductor is connected to one end of a corresponding switch, one end of the second capacitor, and an input end of the radio frequency transmission path, and the other end of the each second capacitor is grounded.

Preferably, the first output matching module includes a second inductor and p third capacitors, and the second output matching module includes q third inductors, p and q being positive integers; one end of the second inductor is connected to the output end of the amplification unit, the other end of the second inductor is connected to one end of each third capacitor, and the other end of the each third inductor is connected to one end of a corresponding switch, one end of the third inductor, and an input end of the radio frequency transmission path, and the other end of the each third inductor is grounded.

Preferably, the radio frequency front end module further includes a third output matching module and a second switch module, where the third output matching module is disposed between the input end of the first output matching module and the output end of the amplification unit, an output end of the third output matching module is connected to an input end of the second switch module, and an output end of the second switch module is correspondingly connected to an input end of the radio frequency transmission path; and the control unit is connected to the second switch module and is configured to control an on-off state of the second switch module, to input the radio frequency signal to any one of the radio frequency transmission paths.

Preferably, the second switch module adopts a single-pole M-throw switch, a common port of the single-pole M-throw switch is connected to the output end of the third output matching module and the input end of the first output matching module, and a plurality of output ends of the single-pole M-throw switch are connected to corresponding input ends of the radio frequency transmission paths.

Preferably, in a case that the radio frequency transmission paths correspondingly connected to the plurality of output ends of the single-pole M-throw switch receive the radio frequency signal, the control unit controls the common port of the single-pole M-throw switch to be connected to any output end of the single-pole M-throw switch, and controls all switches of the first switch module to be in a switch-on state; and in a case that the radio frequency transmission path corresponding to the input end of the first switch module receives the radio frequency signal, the control unit controls the single-pole M-throw switch and a switch connected to the radio frequency transmission path receiving the radio frequency signal to be in a switch-off state, and controls a switch connected to the radio frequency transmission path not receiving the radio frequency signal to be in a switch-on state.

Preferably, the first output matching module includes h fourth capacitors, and the second output matching module includes i fourth inductors, h and i being positive integers; one end of each fourth capacitor is connected to the output end of the third output matching module and the common port of the single-pole M-throw switch the other end of the each fourth capacitor is connected to one end of a corresponding switch in the first switch module, one end of the corresponding fourth inductor in the second output matching module, and a corresponding radio frequency transmission path in the radio frequency transmission paths; and one end of each switch in the first switch module and the other end of the each fourth inductor are separately grounded Preferably, the first output matching module includes j fifth inductors, and the second output matching module includes k fifth capacitors, j and k being positive integers; one end of each fifth inductor is connected to the output end of the third output matching module and the common port of the single-pole M-throw switch; the other end of the each fifth inductor is connected to one end of a corresponding switch in the first switch module, one end of the corresponding fifth capacitor in the second output matching module, and a corresponding radio frequency transmission path in the radio frequency transmission paths; and the other end of each switch in the first switch module and the other end of the each fifth capacitor are separately grounded.

According to a second aspect of the embodiments of the present invention, an integrated circuit chip is provided, including the radio frequency front end module.

According to a third aspect of the embodiments of the present invention, a communication terminal is provided, including the radio frequency front end module.

According to the radio frequency front end module provided in the present invention, radio frequency transmission paths matching the radio frequency front end module can be selected according to different frequency bands under different modes and the control unit controls corresponding switches to be in switch-off and switch-on states, thereby implementing output of radio frequency signals in different frequency bands under different modes. Meanwhile, the existing radio frequency front end module causes additional power loss due to the series connection of single-pole M-throw switches in the signal path, which makes the working current of the radio frequency front end module significantly increase and the linearity and output power of the outputted radio frequency signal poor. With the output matching unit composed of the first output matching module, the first switch module and the second output matching module, the foregoing problems are effectively solved, thereby improving working efficiency and performance of the radio frequency front end module.

DETAILED DESCRIPTION

The technical content of the present invention is further described in detail below with reference to the accompanying drawings and specific embodiments.

First, it should be noted that, in each embodiment of the present invention, the involved communication terminal may be a computer device that is used in a mobile environment, and supports a plurality of communication standards such as GSM, EDGE, TD_SCDMA, TDD_LTE, and FDD_LTE, including mobile phones, notebook computers, tablet computers, on-board computers, Internet of Things terminals, and the like.

Embodiment 1

Figure 1:
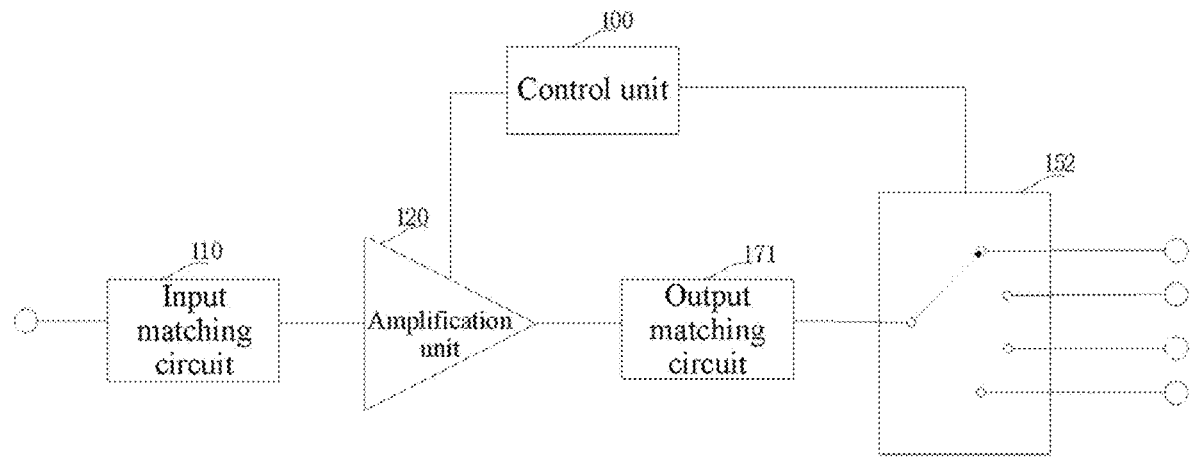
FIG. 1 is a schematic structural diagram of an existing radio frequency front end module.
Figure 2:
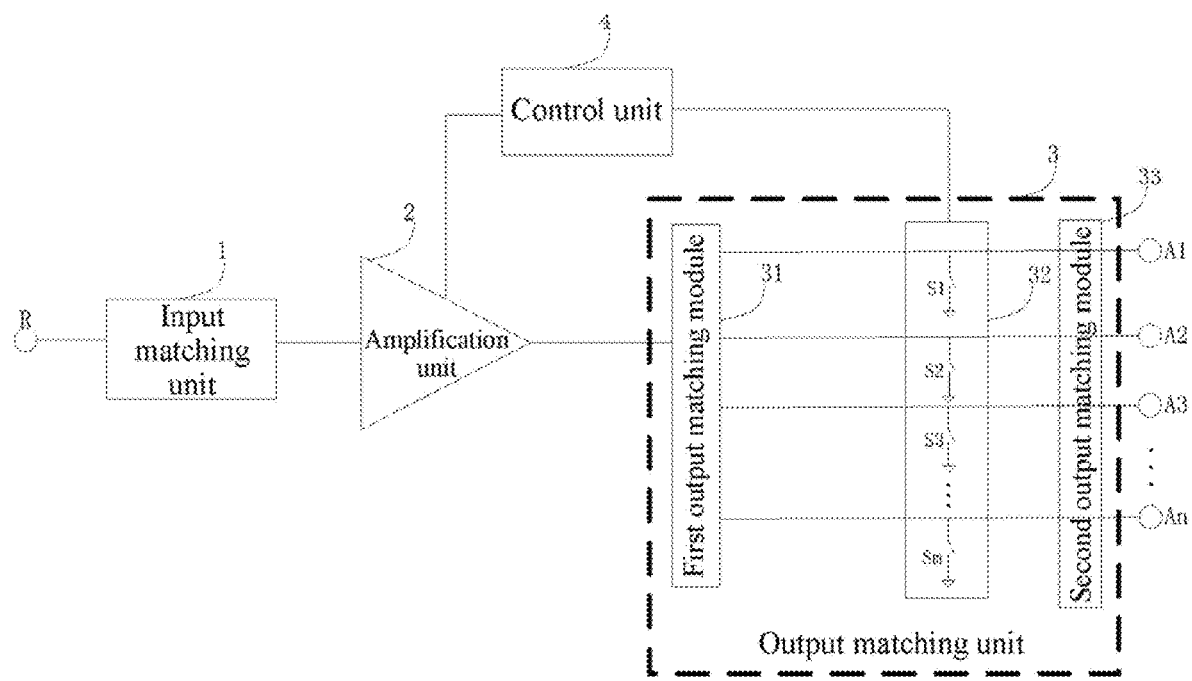
FIG. 2 is a schematic structural diagram of a radio frequency front end module according to Embodiment 1 of the present invention.

As shown in FIG. 2, a radio frequency front end module provided in this embodiment may include an input matching unit 1, an amplification unit 2, an output matching unit 3 and a control unit 4; where the output matching unit 3 includes a first output matching module 31, a first switch module 32 and a second output matching module 33; a radio frequency signal input end R is connected to an input end of the amplification unit 2 through the input matching unit 1, an output end of the amplification unit 2 is connected to an input end of the first output matching module 31; an output end of the first output matching module 31 is correspondingly connected to an input end of the first switch module 32, an input end of the second output matching module 33 and radio frequency transmission paths (A1 to An), and an output end of the first switch module 32 and an output end of the second output matching module 33 are separately grounded. The control unit 4 is connected to the amplification unit 2, and is configured to control a quiescent operating current of the amplification unit 2 and provide a power supply voltage or bias voltage for the amplification unit 2, and the control unit 4 is connected to the first switch module 32, and is configured to control an on-off state of the first switch module 32, to input an amplified radio frequency signal to one or more radio frequency transmission paths.

The input matching unit 1 is an input matching module configured to implement impedance matching (impedance transformation) between a signal source (a module preamp circuit) and the amplification unit 2; the amplification unit 2 is a broadband amplifier on a specified frequency band, and is configured to amplify power of a radio frequency signal; the output matching unit 3 is configured to implement impedance matching between the amplification unit 2 and the one or more radio frequency transmission paths (A1 to An); and after the radio frequency signal amplified by the amplification unit 2 is divided into one or more paths of radio frequency signals, the first switch module 32 is controlled by the control unit 4 to input the radio frequency signal into the corresponding one or more radio frequency transmission paths (A1 to An).

In addition, the first output matching module 31 not only can implement the impedance matching between the amplification unit 2 and the one or more radio frequency transmission paths (A1 to An), but also can divide the radio frequency signal amplified by the amplification unit 2 into one or more paths and input the signals into the first switch module 32; according to requirements of a terminal, the control unit 4 controls the on-off state of the first switch module 32, so that the radio frequency signal is inputted into a specific radio frequency transmission path and then transmitted into a next-stage circuit; and the impedance matching between the amplification unit 2 and the one or more radio frequency transmission paths (A1 to An) can also be implemented through the first switch module 32 and the second output matching module 33. The input matching module 1 and the first output matching module 31 may be designed to correspond to a frequency range of the amplification unit 2.

As shown in FIG. 2, the first switch module 32 includes m (m is a positive integer) switches (S1 to Sm). The number of switches in the first switch module 32 is the same as that of output ends of the first output matching module 31 and the same as that of radio frequency transmission paths; and in the first switch module 32, one end of each switch is connected to a corresponding radio frequency transmission path and a corresponding output end in the first output matching module 31, and the other end of the each switch is grounded. According to different requirements, the first switch module 32 can be controlled by the control unit 4 to select whether radio frequency transmission paths correspondingly connected to any one or more switches receive radio frequency signals. Specifically, when any one or more radio frequency transmission paths need to receive radio frequency signals, the control unit 4 may control the switch connected to the radio frequency transmission path that needs to receive the radio frequency signal to be in a switch-off state, and control the switch connected to the radio frequency transmission path that does not need to receive radio frequency signal to be in a switch-on state.

In this case, turn-off parasitic capacitance generated by a switch in a switch-off state in the first switch module 32 may implement, together with the second output matching module 33, impedance matching between the amplification unit 2 and the one or more radio frequency transmission paths (A1 to An), thereby avoiding affecting radio frequency signal bandwidth and increasing the radio frequency transmission path of additional radio frequency signal loss. To further optimize quality of the radio frequency signal, the area of the switch can be increased when the first switch module 32 is designed, to reduce the parasitic resistance generated by the switch.

In this embodiment, the output matching unit 3 can adopt two structures. The specific structure of the output matching unit 3 will be described in detail below with reference to FIG. 3 to FIG. 6.

Figure 3:
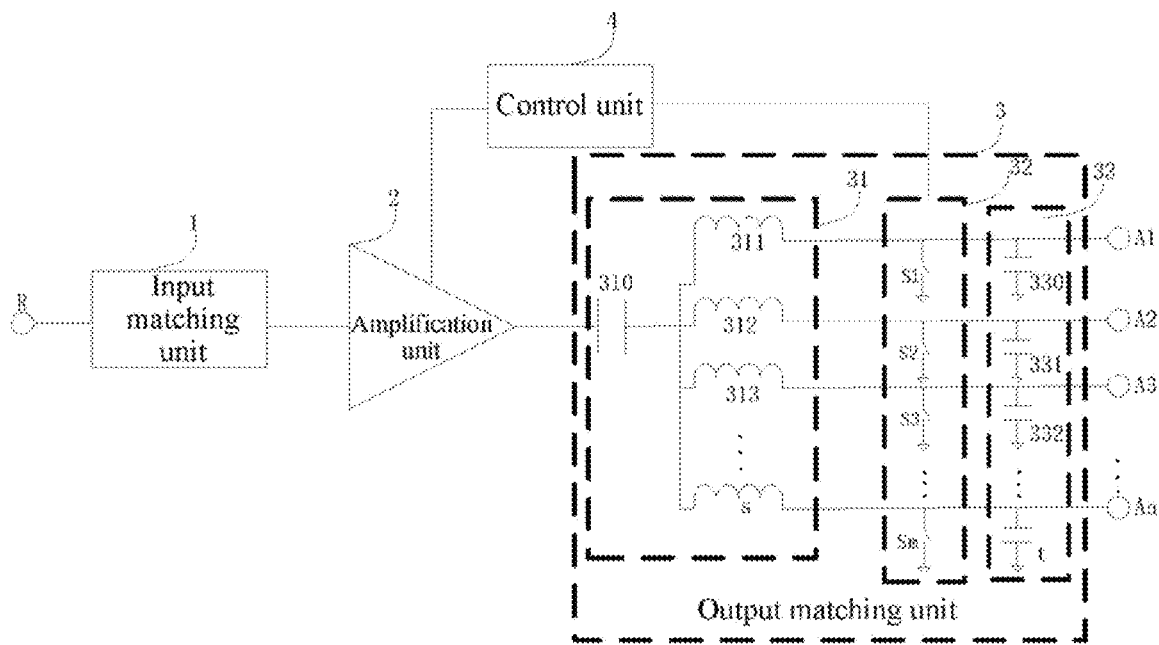
FIG. 3 is a schematic diagram of a specific structure of a radio frequency front end module according to Embodiment 1 of the present invention.
Figure 4:
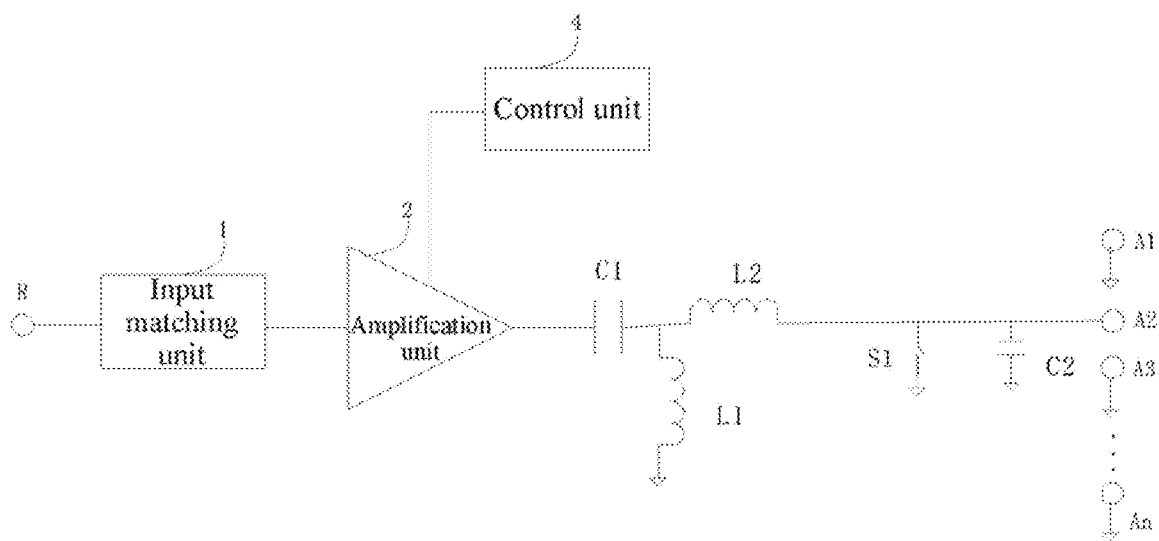
FIG. 4 is a schematic diagram of an equivalent principle of the radio frequency front end module according to Embodiment 1 shown in FIG. 3.

As shown in FIG. 3, in a structure of the output matching unit 3 provided in this embodiment, the structure and principle of the first switch module 32 are similar to the above, and details are not described herein again. The first output matching module 31 includes a first capacitor 310 and s first inductors (a first inductor 311, a first inductor 312, a first inductor 313, . . ., and a first inductor s, s being a positive integer); one end of the first capacitor 310 is connected to the output end of the amplification unit 2, the other end of the first capacitor 310 is connected to one end of each first inductor, and the other end of the each first inductor serves as each output end of the first output matching module 31 The second output matching module 33 includes t second capacitors (a second capacitor 330, a second capacitor 331, a second capacitor 332, . . . , and a second capacitor t, t being a positive integer); and numbers of the first inductors in the first output matching module 31, the switches in the first switch module 32, and the second capacitors in the second output matching module 33 are the same In addition, the other end of the each first inductor is connected to one end of a corresponding switch in the first switch module 32, one end of a corresponding second capacitor in the second output matching module 33, and an input end of a corresponding radio frequency transmission path, and the other end of each second capacitor in the second output matching module 33 is grounded As shown in FIG. 3 and FIG. 4, for example, a radio frequency transmission path connected to a switch S1 in the first switch module 32 needs to receive radio frequency signals. The control unit 4 controls the switch S1 to be in a switch-off state, and the control unit 4 controls all switches other than the switch S1 in the first switch module 32 to be in a switch-on state. In this case, as shown in FIG. 4, the first capacitor 310 can be equivalent to a capacitor C1, the first inductor 312, the first inductor 313, and the first inductor s are grounded respectively through switches S2, S3, . . . , and Sm. Therefore, the first inductor 312, the first inductor 313, . . . , and the first inductor s can be equivalent to an inductor L1; the first inductor 311 is equivalent to an inductor L2; and the second capacitor 330 is equivalent to a capacitor C2, and the second capacitor 331, the second capacitor 332, . . . , and the second capacitor t are grounded at both ends, which can be ignored. Therefore, a CLLC impedance matching structure is formed by the capacitor C1, the inductor L1, the inductor L2, and the capacitor C2. After initial impedance matching between the amplification unit 2 and a radio frequency transmission path A1 is implemented through the capacitor C1 and the inductor L2, the impedance matching between the amplification unit 2 and the radio frequency transmission path A1 is implemented through the turn-off parasitic capacitance generated by the switch S1 and the capacitor C2, thereby avoiding the impact of additional power loss caused by the switch on the quality of the radio frequency signal inputted to the radio frequency transmission path A1 Because the inductor L1 is grounded through the corresponding switch, to alleviate the impact of the parasitic resistance generated by a plurality of switches connected to the inductor L1 on a quality factor Q value of the radio frequency front end module, the area of the plurality of switches connected to the inductor L1 can also be increased during the design, to reduce the parasitic resistance generated by the switches and further optimize the quality of the radio frequency signal.

In addition, during practical application, to increase the quality factor Q value of the radio frequency front end module and further improve the quality of the radio frequency signal, the radio frequency transmission paths that do not need to receive radio frequency signals may be grounded separately. In addition, the second capacitor 330, the second capacitor 331, the second capacitor 332, . . . , and the second capacitor t may be disposed on an area where a corresponding switch in the first, switch module 32 is located; they can also be integrated in a preset position of the radio frequency front end module in the foie of surface mounted devices (SMD for short); and they can further be disposed on an application device outside the radio frequency front end module. The second capacitor 330, the second capacitor 331, the second capacitor 332, . . . , and the second capacitor t can select different capacitance values according to requirements of different frequency bands, to implement an optimized design of the frequency bands.

Figure 5:
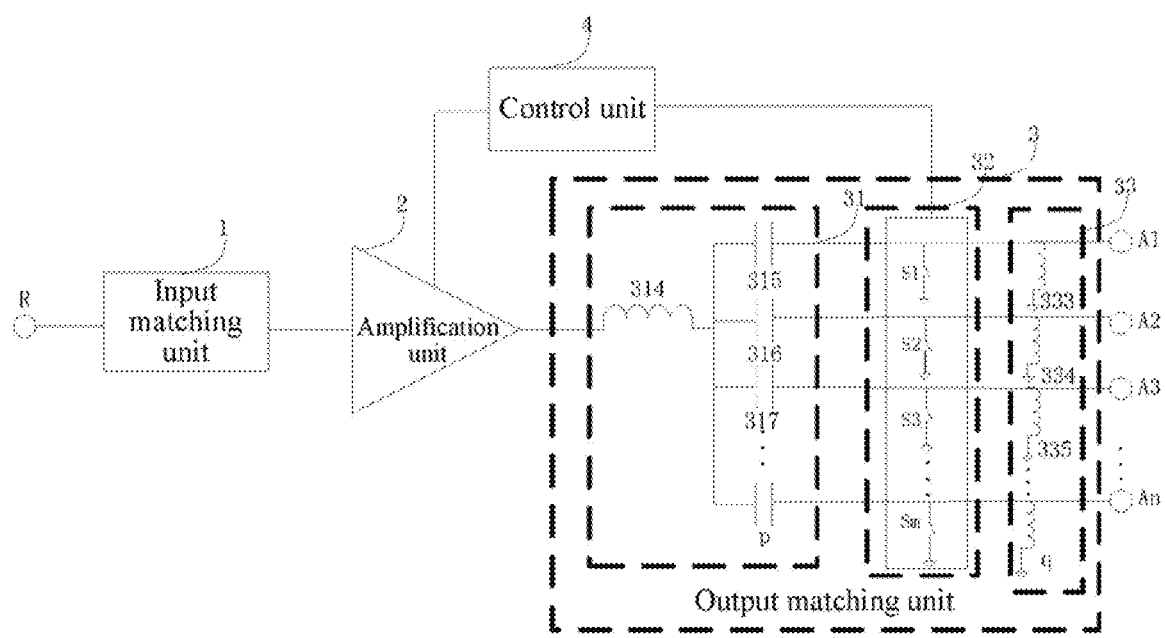
FIG. 5 is a schematic diagram of another specific stricture of the radio frequency front end module according to Embodiment 1 of the present invention.

As shown in FIG. 5, in another structure of the output matching unit 3 provided in this embodiment, the structure and principle of the first switch module 32 are similar to the above, and details are not described herein again. The first output matching module 31 includes a second inductor 314 and p third capacitors (a third capacitor 315, a third capacitor 316, a third capacitor 317, . . . , and a third capacitor p, p being a positive integer); one end of the second inductor 314 is connected to the output end of the amplification unit 2, the other end of the second inductor 314 is connected to one end of each third capacitor, and the other end of the each third capacitor serves as each output end of the first output matching module 31. The second output matching module 33 includes q third inductors (a third inductor 333, a third inductor 334, a third inductor 335, . . . , and a third inductor q, q being a positive integer); numbers of the third capacitors in the first output matching module 31, the switches in the first switch module 32, and the third inductors in the second output matching module 33 are the same. In addition, the other end of the each third capacitor is connected to one end of a corresponding switch in the first switch module 32, one end of a corresponding third inductor in the second output matching module 33, and an input end of a corresponding radio frequency transmission path, and the other end of each third inductor in the second output matching module 33 is grounded.

Figure 6:
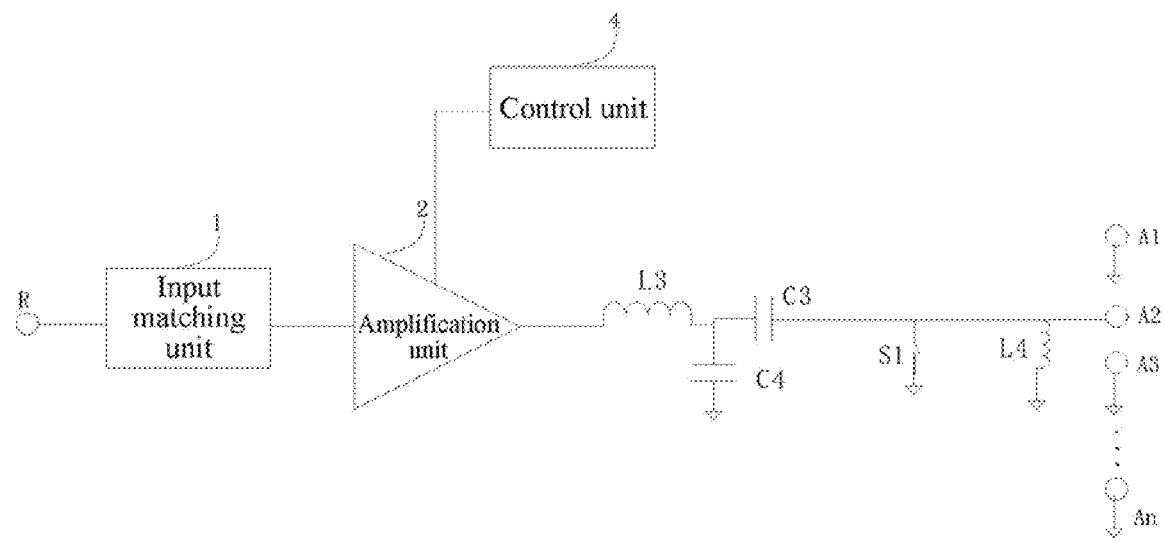
FIG. 6 is a schematic diagram of an equivalent principle of the radio frequency front end module according to Embodiment 1 shown in FIG. 5.

As shown in FIG. 5 and FIG. 6, that a radio frequency transmission path connected to a switch S1 in the first switch module 32 needs to receive radio frequency signals is still used as an example. The control unit 4 controls the switch S1 to be in a switch-off state, and the control unit 4 controls all switches other than the switch S1 in the first switch module 32 to be in a switch-on state. In this case, as shown in FIG. 6, the second inductor 314 can be equivalent to a capacitor L3; the third capacitor 315, the third capacitor 316, the third capacitor 317, and the third capacitor p are grounded respectively through switches S2, S3, . . . , and Sm. Therefore, the third capacitor 316, the third capacitor 317, . . . , and the third capacitor p can be equivalent to a capacitor C4, the third capacitor 315 is equivalent to a capacitor C3, and the third inductor 333 is equivalent to an inductor L4, and the third inductor 334, the third inductor 335, . . . , and the third inductor t are grounded at both ends, which can be ignored. Therefore, an LCCL impedance matching structure is formed by the capacitor L3, the capacitor C4, the capacitor C3, and the inductor L4. After initial impedance matching between the amplification unit 2 and a radio frequency transmission path A1 is implemented through the inductor L3 and the capacitor C3, the impedance matching between the amplification unit 2 and the radio frequency transmission path A1 is implemented through the turn-off parasitic capacitance generated by the switch S1 and the inductor L4, thereby avoiding the impact of additional power loss caused by the switch on the quality of the radio frequency signal inputted to the radio frequency transmission path A1. Because the capacitor C4 is grounded through the corresponding switch, to alleviate the impact of the parasitic resistance generated by a plurality of switches connected to the capacitor C4 on a quality factor Q value of the radio frequency front end module, the area of the plurality of switches connected to the capacitor C4 can also be increased during the design, to reduce the parasitic resistance generated by the switches and further optimize the quality of the radio frequency signal.

In addition, during practical application, to increase the quality factor Q value of the radio frequency front end module and further improve the quality of the radio frequency signal, the radio frequency transmission paths that do not need to receive radio frequency signals may be grounded separately. In addition, the third inductor 333, the third inductor 334, the third inductor 335, . . . , and the third inductor q can be integrated in a preset position of the radio frequency front end module in the form of surface mounted devices (SMD for short); and they can further be disposed on an application device outside the radio frequency front end module. The third inductor 333, the third inductor 334, the third inductor 335, . . . , and the third inductor q can select different inductance values according to requirements of different frequency bands, to implement an optimized design of the frequency bands.

When the radio frequency front end module works in a mode and frequency band with relatively high requirements for currents, the existing radio frequency front end module causes additional power loss due to the series connection of single-pole M-throw switches in the signal path, which makes the working current of the radio frequency front end module significantly increase and the linearity and output power of the outputted radio frequency signal poor. In this embodiment, the first switch module 32 connects one end of each of a plurality of independent switches to a corresponding output end in the first output matching module 31 and the other end of the each of the plurality of independent switches is grounded. Therefore, the foregoing problems are effectively solved.

Embodiment 2

Figure 7:
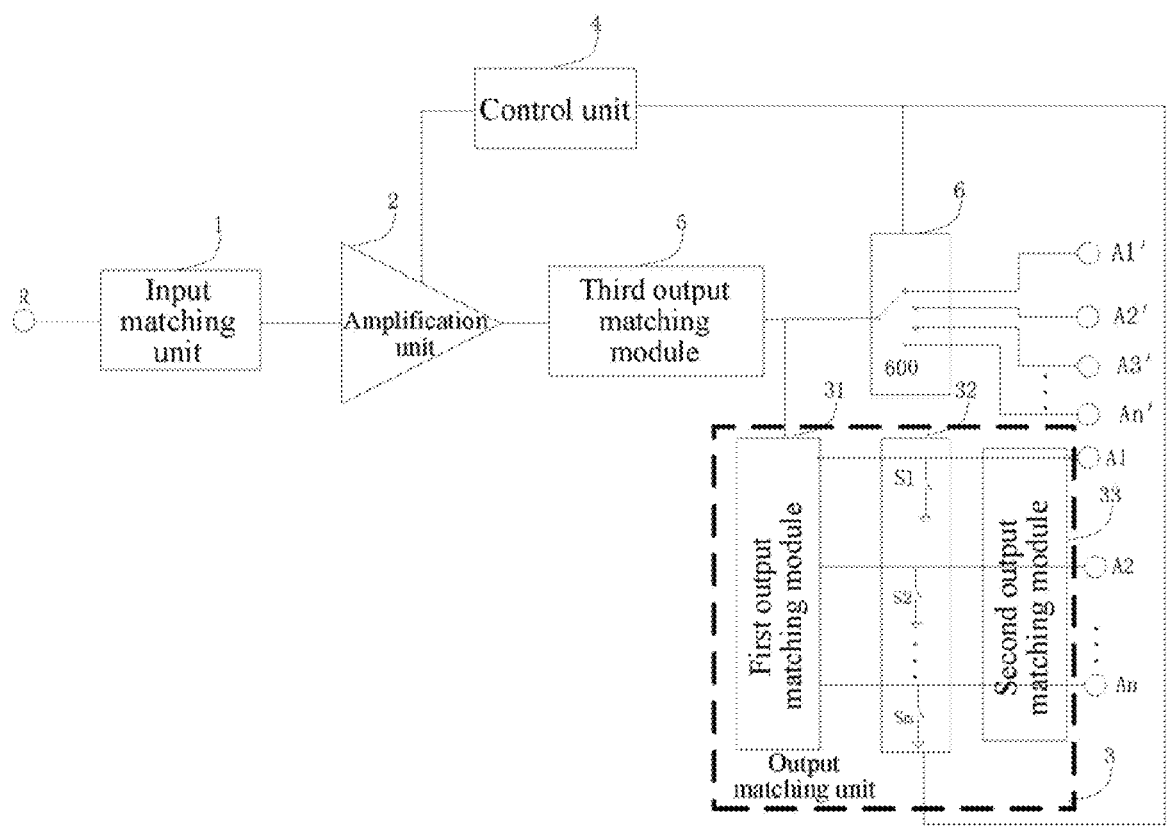
FIG. 7 is a schematic structural diagram of a radio frequency front end module according to Embodiment 2 of the present invention.

As shown in FIG. 7, a structure of the radio frequency front end module provided in this embodiment is different from the radio frequency front end module provided in Embodiment 1 in that a third output matching module 5 and a second switch module 6 are additionally added to the radio frequency front end module provided in this embodiment based on the structure of the radio frequency front end module provided in Embodiment 1, the third output matching module 5 is disposed between the input end of the first output matching module 31 in the output matching unit 3 and the output end of the amplification unit 2, an output end of the third output matching module 5 is also connected to an input end of the second switch module 6, and an output end of the second switch module 6 is correspondingly connected to radio frequency transmission paths (A to AV). The control unit 4 is connected to the second switch module 6 and is configured to control an on-off state of the second switch module 6, to input an amplified radio frequency signal to any one of the radio frequency transmission paths. In the structure of the radio frequency front end module provided in this embodiment, the same parts as those in the radio frequency front end module provided in Embodiment 1 are not described again.

The third output matching module 5 is an output matching circuit for implementing impedance matching between the amplification unit 2 and any one of the radio frequency transmission paths (A1' to An'), and at the same time, the radio frequency signal amplified by the amplification unit 2 is inputted to any one of the radio frequency transmission paths (A1' to An') through the second switch module 6. As shown in FIG. 7, the second switch module 6 may adopt a single-pole M-throw switch 600, a common port of the single-pole M-throw switch 600 being connected to the output end of the third output matching module 5 and the input end of the first output matching module 31, and a plurality of output ends of the single-pole M-throw switch 600 are connected to input ends of corresponding radio frequency transmission paths. According to different requirements, the common port of the single-pole M-throw switch 600 can be connected to any output end of the single-pole M-throw switch 600 through the control unit 4, so that the radio frequency signal amplified by the amplification unit 2 is inputted to the radio frequency transmission path connected to any output end of the single-pole M-throw switch 600.

When the radio frequency front end module provided in this embodiment works in a mode and frequency band with relatively low requirements for currents, the common port of the single-pole M-throw switch 600 can be connected to any output end of the single-pole M-throw switch 600 through the control unit 4, and the control unit 4 controls all switches in the first switch module 32 to be in a switch-on state In this case, the radio frequency signal can be inputted, through the single-pole M-throw switch, to a radio frequency transmission path connected to any output end of the single-pole M-throw switch 600, and transmitted to a next-stage circuit.

When the radio frequency front end module provided in this embodiment works in a mode and frequency band with relatively high requirements for currents, the control unit 4 can control any switch in the second switch module 32 to be in a switch-off state and can separately control other switches in the second switch module 32 to be in a switch-on state, and the single-pole M-throw switch 600 in the first switch module 6 is controlled by the control unit 4 to be in a switch-off state (the common port of the single-pole M-throw switch 600 is not connected to all output ends of the single-pole M-throw switch 600). In this case, turn-off parasitic capacitance generated by a switch in a switch-off state in the first switch module 32 may implement, together with the second output matching module 33, impedance matching between the amplification unit 2 and the one or more radio frequency transmission paths (A1 to An), thereby avoiding affecting radio frequency signal bandwidth and increasing the radio frequency transmission path of additional radio frequency signal loss. To further optimize quality of the radio frequency signal, the area of the switch can be increased when the first switch module 32 is designed, to reduce the parasitic resistance generated by the switch.

In this embodiment, the output matching unit 3 can also adopt two structures. The specific structures of the output matching unit 3 will be described in detail below with reference to FIG. 8 and FIG. 9.

Figure 8:
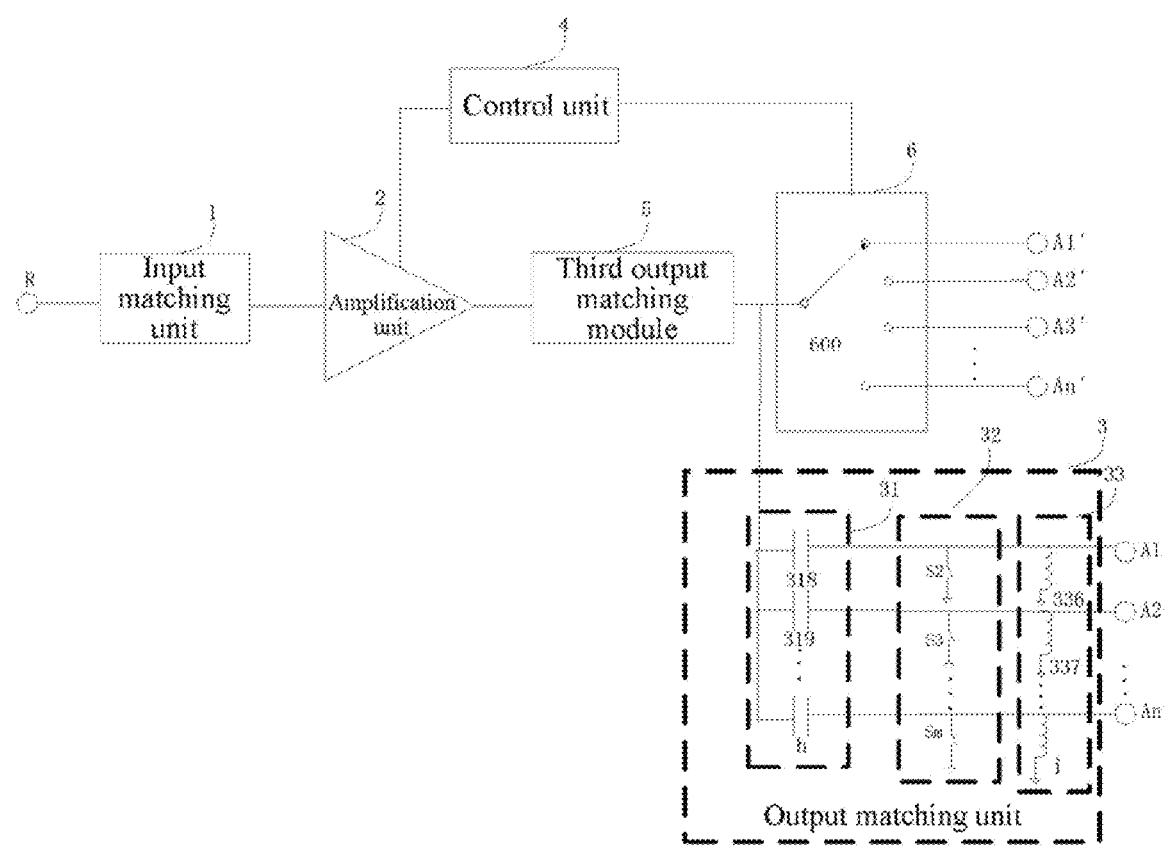
FIG. 8 is a schematic diagram of a specific structure of the radio frequency front end module according to Embodiment 2 of the present invention.

As shown in FIG. 8, in a structure of the output matching unit 3 provided in this embodiment, the structure and principle of the first switch module 32 are similar to those described in Embodiment 1, and details are not repeated herein. The first output matching module 31 includes h fourth capacitors (a fourth capacitor 318, a fourth capacitor 319, . . . , and a fourth capacitor h, h being a positive integer), and the second output matching module 33 includes i fourth inductors (a fourth inductor 336, a fourth inductor 337, . . . , and a fourth inductor i, i being a positive integer) The number of the fourth capacitors and that of the fourth inductors are respectively the same as that of switches of the first switch module 32 and that of radio frequency transmission paths. One end of each fourth capacitor is connected to the output end of the third output matching module 5 and the input end of the second switch module 6; the other end of the each fourth capacitor is connected to one end of a corresponding switch in the first switch module 32, one end of the corresponding fourth inductor in the second output matching module 33, and a corresponding radio frequency transmission path in the radio frequency transmission paths (A1 to An); and the other end of each switch in the first switch module 32 and the other end of the each fourth inductor in the second output matching module 33 are separately grounded.

Figure 9:
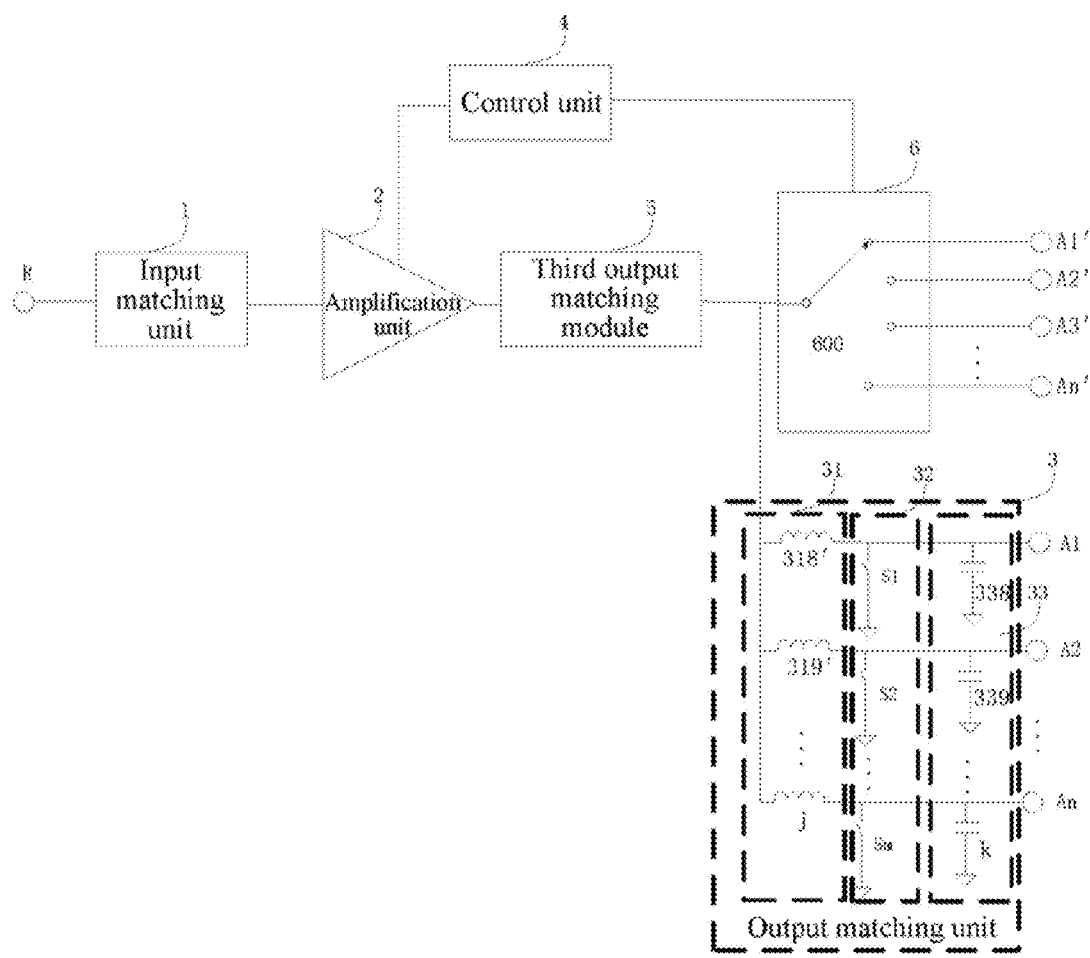
FIG. 9 is a schematic diagram of another specific structure of the radio frequency front end module according to Embodiment 2 of the present invention.

In this embodiment, for example, the radio frequency front end module works in a mode and frequency band with relatively high requirements for currents, and any one of the radio frequency transmission paths (A1 to An) needs to receive a radio frequency signal The control unit 4 controls a corresponding switch in the first switch module 32 connected to any radio frequency transmission path to be in a switch-off state, the control unit 4 controls the other switches of the first switch module 32 to be in a switch-on state; and the control unit 4 controls a switch in the second switch module 6 to be in a switch-off state, so that the radio frequency signal can be inputted to any radio frequency transmission path. The fourth inductor in the second output matching module 33 may select different inductance values according to requirements of different frequency bands, to implement an optimized design of the frequency bands As shown in FIG. 9, in another structure of the output matching unit 3 provided in this embodiment, the structure and principle of the first switch module 32 are similar to those described in Embodiment 1, and details are not repeated herein. The first output matching module 31 includes j fifth inductors (a fifth inductor 318', a fifth inductor 319', . . . , and a fifth inductor j, j being a positive integer), and the second output matching module 33 includes k fifth capacitors (a fifth capacitor 338, a fifth capacitor 339, . . . , and a fifth capacitor k, k being a positive integer). The number of the fifth capacitors and that of the fifth inductors are respectively the same as that of switches of the first switch module 32 and that of radio frequency transmission paths. One end of each fifth inductor is connected to the output end of the third output matching module 5 and the input end of the second switch module 6; the other end of the each fifth inductor is connected to one end of a corresponding switch in the first switch module 32, one end of the corresponding fifth capacitor in the second output matching module 33, and a corresponding, radio frequency transmission path in the radio frequency transmission paths (A1 to An); and the other end of each switch in the first switch module 32 and the other end of the each fifth capacitor in the second output matching module 33 are separately grounded.

In this embodiment, for example, the radio frequency front end module works in a mode and frequency band with relatively high requirements for currents, and any one of the radio frequency transmission paths (A1 to An) needs to a receive radio frequency signal. The control unit 4 controls a corresponding switch in the first switch module 32 connected to any radio frequency transmission path to be in a switch-off state; the control unit 4 controls the other switches of the first switch module 32 to be in a switch-on state; and the control unit 4 controls a switch in the second switch module 6 to be in a switch-off state, so that the radio frequency signal can be inputted to any radio frequency transmission path. The fifth capacitor in the second output matching module 33 may select different capacitance values according to requirements of different frequency bands, to implement an optimized design of the frequency bands Therefore, the radio frequency front-end module provided in this embodiment can input radio frequency signals into any radio frequency transmission path when working in a mode and frequency band with relatively low requirements for currents; and when working in a mode and frequency band with relatively high requirements for currents, the radio frequency front end module provided in this embodiment effectively solves the problem of the existing radio frequency front end module, which causes additional power loss due to the series connection of single-pole M-throw switches in the signal path, which makes the working current of the radio frequency front end module significantly increase and the linearity and output power of the outputted radio frequency signal poor.

Figure 10:
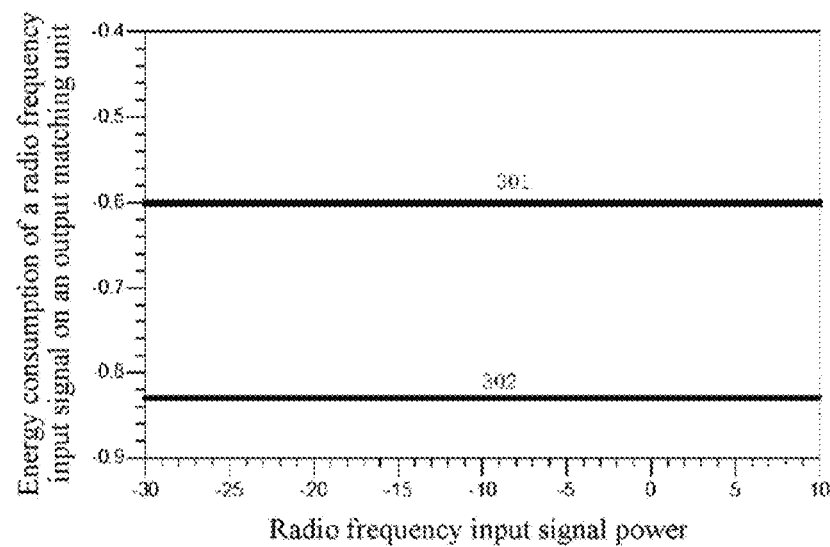
FIG. 10 is a diagram of comparison between energy loss of a radio frequency signal of the existing radio frequency front end module on an output matching module and energy loss of a radio frequency signal of the radio frequency front end module provided in the present invention on the output matching module.

As shown in FIG. 10, when the radio frequency front end module provided in the present invention works in a mode and frequency band with relatively high requirements for currents, it is not difficult to find that energy loss (an energy consumption line 302 in FIG. 10, and an energy consumption value takes the absolute value) of a radio frequency signal on an output matching module of the existing radio frequency front end module adopting a single-pole M-throw switch is much higher than that (an energy consumption line 301 in FIG. 10, and an energy consumption value only takes the absolute value) of the radio frequency front end module adopting a plurality of independent switches in the present invention. Therefore, the radio frequency front end module herein has great advantages over existing products.

According to the radio frequency front end module provided in the present invention, radio frequency transmission paths matching the radio frequency front end module can be selected according to different frequency bands under different modes and the control unit controls corresponding switches to be in switch-off and switch-on states, thereby implementing output of radio frequency signals in different frequency bands under the different modes. Meanwhile, the existing radio frequency front end module causes additional power loss due to the series connection of single-pole M-throw switches in the signal path, which makes the working current of the radio frequency front end module significantly increase and the linearity and output power of the outputted radio frequency signal poor. With the output matching unit composed of the first output matching module, the first switch module and the second output matching module, the foregoing problems are effectively solved, thereby improving working efficiency and performance of the radio frequency front end module.

The radio frequency front end module provided in the present invention can be used in an integrated circuit chip. The specific structure of the radio frequency front end module in the integrated circuit chip is not described in detail herein again.

In addition, the foregoing radio frequency front end module can further be used in a communication terminal as an important part of a radio frequency circuit. The communication terminal herein is a computer device that can be used in a mobile environment and supports a plurality of communication standards such as GSM, EDGE, TD_SCDMA, TDD_LTE, and FDD_LTE, including mobile phones, notebook computers, tablet computers, on-board computers, and the like In addition, the radio frequency front end module is also applicable to occasions of other communication technology applications, such as communication base stations compatible with a plurality of communication standards, which will not be detailed in detail herein The multi-mode and multi-frequency radio frequency front end module, the chip, and the communication terminal provided in the present invention are described in detail above. For those of ordinary skill in this field, any obvious change made to the present invention without departing from the essential spirit of the invention shall fall within the protection scope of the patent right of the present invention.

What is claimed is:

1. A multi-mode and multi-frequency radio frequency front end module, comprising an input matching unit, an amplification unit, an output matching unit and a control unit; wherein the output matching unit comprises a first output matching module, a first switch module and a second output matching module; a radio frequency signal input end is connected to an input end of the amplification unit through the input matching unit; an output end of the amplification unit is connected to an input end of the first output matching module; an output end of the first output matching module is correspondingly connected to an input end of the first switch module, an input end of the second output matching module and a radio frequency transmission path; an output end of the first switch module and an output end of the second output matching module are separately grounded; the control unit is connected to the amplification unit;

the first switch module comprises m switches, m being a positive integer; and one end of each switch is connected to a corresponding radio frequency transmission path and a corresponding output end in the first output matching module, and the other end of the each switch is grounded, and the control unit is connected to the first switch module and is configured to control an on-off state of the first switch module, to input a radio frequency signal to one or more radio frequency transmission paths.

2. The multi-mode and multi-frequency radio frequency front end module according to claim 1, wherein the input matching unit is configured to implement impedance matching between a signal source and the amplification unit; the output matching unit is configured to implement impedance matching between the amplification unit and the one or more radio frequency transmission paths;

and after the radio frequency signal is divided into one or more paths of radio frequency signals, the radio frequency signal is inputted into the corresponding one or more radio frequency transmission paths by controlling the first switch module.

3. The multi-mode and multi-frequency radio frequency front end module according to claim 1, wherein in a case that the radio frequency transmission path receives the radio frequency signal, the control unit controls a switch connected to the radio frequency transmission path receiving the radio frequency signal to be in a switch-off state, and controls a switch connected to the radio frequency transmission path not receiving the radio frequency signal to be in a switch-on state.

4. The multi-mode and multi-frequency radio frequency front end module according to claim 3, wherein the first output matching module comprises a first capacitor and s first inductors, and the second output matching module comprises t second capacitors, s and t being positive integers, one end of the first capacitor is connected to the output end of the amplification unit, and the other end of the first capacitor is connected to one end of each first inductor, and the other end of the each first inductor is connected to one end of a corresponding switch, one end of the second capacitor, and an input end of the radio frequency transmission path, and the other end of the each second capacitor is grounded.

5. The multi-mode and multi-frequency radio frequency front end module according to claim 3, wherein the first output matching module comprises a second inductor and p third capacitors, and the second output matching module comprises q third inductors, p and q being positive integers, one end of the second inductor is connected to the output end of the amplification unit, the other end of the second inductor is connected to one end of each third capacitor, and the other end of the each third inductor is connected to one end of a corresponding switch, one end of the third inductor, and an input end of the radio frequency transmission path, and the other end of the each third inductor is grounded.

6. The multi-mode and multi-frequency radio frequency front end module according to claim 1, further comprising a third output matching module and a second switch module, wherein the third output matching module is disposed between the input end of the first output matching module and the output end of the amplification unit, an output end of the third output matching module is connected to an input end of the second switch module, and an output end of the second switch module is correspondingly connected to the radio frequency transmission path; and the control unit is connected to the second switch module and is configured to control an on-off state of the second switch module, to input the radio frequency signal to any one of the radio frequency transmission paths.

7. The multi-mode and multi-frequency radio frequency front end module according to claim 6, wherein the second switch module adopts a single-pole M-throw switch, a common port of the single-pole M-throw switch is connected to the output end of the third output matching module and the input end of the first output matching module, and a plurality of output ends of the single-pole M-throw switch are connected to corresponding input ends of the radio frequency transmission paths.

8. The multi-mode and multi-frequency radio frequency front end module according to claim 7, wherein in a case that the radio frequency transmission paths correspondingly connected to the plurality of output ends of the single-pole M-throw switch receive the radio frequency signal, the control unit controls the common port of the single-pole M-throw switch to be connected to any output end of the single-pole M-throw switch, and controls all switches of the first switch module to be in a switch-on state; and in a case that the radio frequency transmission path corresponding to the input end of the first switch module receives the radio frequency signal, the control unit controls the single-pole M-throw switch and a switch connected to the radio frequency transmission path receiving the radio frequency signal to be in a switch-off state, and controls a switch connected to the radio frequency transmission path not receiving the radio frequency signal to be in a switch-on state.

9. The multi-mode and multi-frequency radio frequency front end module according to claim 8, wherein the first output matching module comprises h fourth capacitors, and the second output matching module comprises i fourth inductors, h and i being positive integers; one end of each fourth capacitor is connected to the output end of the third output matching module and the common port of the single-pole M-throw switch; the other end of the each fourth capacitor is connected to one end of a corresponding switch in the first switch module, one end of the corresponding fourth inductor in the second output matching module, and a corresponding radio frequency transmission path in the radio frequency transmission paths; and one end of each switch in the first switch module and the other end of the each fourth inductor are separately grounded.

10. The multi-mode and multi-frequency radio frequency front end module according to claim 8, wherein the first output matching module comprises j fifth inductors, and the second output matching module comprises k fifth capacitors, j and k being positive integers; one end of each fifth inductor is connected to the output end of the third output matching module and the common port of the single-pole M-throw switch; the other end of the each fifth inductor is connected to one end of a corresponding switch in the first switch module, one end of the corresponding fifth capacitor in the second output matching module, and a corresponding radio frequency transmission path in the radio frequency transmission paths; and the other end of each switch in the first switch module and the other end of the each fifth capacitor are separately grounded.

11. An integrated circuit chip, wherein the integrated circuit chip comprises the radio frequency front end module according to claim 1.

12. A communication terminal, wherein the communication terminal comprises the radio frequency front end module according to claim 1.

* * * * *